United States Patent [19]

Meador et al.

[11] Patent Number: 5,584,062
[45] Date of Patent: Dec. 10, 1996

[54] METHOD AND APPARATUS FOR COMPENSATING PHASE LOCKED RECEIVERS

[75] Inventors: Richard B. Meador, Sunrise; Joseph P. Heck, Ft. Lauderdale, both of Fla.

[73] Assignee: Motorola, Inc., Schaumburg, Ill.

[21] Appl. No.: 427,926

[22] Filed: Apr. 26, 1995

Related U.S. Application Data

[63] Continuation of Ser. No. 185,089, Jan. 24, 1994, abandoned.
[51] Int. Cl.⁶ .................................................. H04B 1/16
[52] U.S. Cl. .................... 455/260; 455/208; 455/305; 329/325; 331/23
[58] Field of Search ...................... 455/260, 258, 455/259, 264, 265, 266, 295, 308, 309, 312, 305; 329/320, 325, 323; 331/17, 23

[56] References Cited

U.S. PATENT DOCUMENTS

| | | | |
|---|---|---|---|
| 4,242,649 | 12/1980 | Washburn, Jr. | 331/23 |
| 4,313,209 | 1/1982 | Drucker | 455/112 |
| 4,742,566 | 5/1988 | Nordholt et al. | 455/260 |
| 4,743,867 | 5/1988 | Smith | 332/16 R |
| 4,837,853 | 6/1989 | Heck | 455/260 |
| 5,079,526 | 1/1992 | Heck | 332/127 |
| 5,402,446 | 3/1995 | Minami | 455/260 |
| 5,412,353 | 5/1995 | Chaplik et al. | 331/23 |

*Primary Examiner*—Edward F. Urban
*Attorney, Agent, or Firm*—Barbara R. Doutre

[57] ABSTRACT

Receiver section (200) includes a compensation network (202) which compensates for undesired effects caused by synthesized LO (204). Compensation network (202) substantially duplicates the amplitude and phase delay of synthesized LO (204) allowing for a substantially flat demodulated frequency response to be achieved at output (122) which is independent of the bandwidth of synthesized LO (204).

13 Claims, 7 Drawing Sheets

METHOD AND APPARATUS FOR COMPENSATING PHASE LOCKED RECEIVERS

This is a continuation of application Ser. No. 08/185,089, filed Jan. 24, 1994, and now abandoned.

TECHNICAL FIELD

This invention relates in general to phase lock loops (PLL's) and more specifically to a method and apparatus for compensating a local oscillator PLL that is part of the demodulation process of a phase locked receiver.

BACKGROUND

Phase lock loops are used extensively in modern FM communication receivers and transmitters. In recent years, PLLs have been used to control the local oscillator (LO) of superheterodyne receivers to produce an intermediate frequency (IF). The incoming RF signal is mixed with the LO signal to provide a lower intermediate frequency at which filtering and amplification are more readily achieved. The advantages of amplification and filtering at a lower intermediate frequency are well-known and are described in the literature. A conventional PLL locks the LO to a fixed frequency, determined by the reference oscillator frequency and other loop parameters, such as divider ratios. Additional controlling means can be used to lock the LO to the received signal. The main advantage of phase locking the LO to the received signal is to eliminate the frequency error between the received carrier frequency and the LO frequency that would otherwise occur if the LO operated at a fixed frequency. In narrow band, high frequency FM systems, elimination of the frequency error is necessary to eliminate distortion caused by system imperfections. For example, in some cases the frequency of the incoming RF signal which is received may vary up to +/−5 ppm (parts-per-million) from the assigned frequency due to component make tolerances and/or due to the effects of aging and temperature on component values. At UHF frequencies of 800 MHz and above, a +/−5 ppm error in the incoming RF signal can result in a +/−4 KHz frequency error in the intermediate frequency. Similarly, the receiver LO signal may also exhibit up to a +/−5 ppm error due to imperfect components and the effects of aging and temperature. The frequency error of the LO signal is added to the frequency error of the incoming RF signal resulting in a net frequency error at the intermediate frequency.

This frequency error can cause the converted IF signal to fall on the edge or outside the pass band of the narrow band IF filter stage. Operation at the edge or outside the bandwidth of the IF filter results in undesired distortion of the FM signal. Phase lock control is a way of greatly reducing the frequency error that occurs at the intermediate frequency. Phase lock control of an FM receiver can be accomplished by comparing an intermediate frequency signal in the receiver with a stable reference frequency using a phase detector. The phase detector is known as the control loop phase detector. The intermediate frequency may be divided by a frequency divider stage of value "N" prior to the phase detector. If the intermediate frequency is divided by a divider stage, the value of the intermediate frequency is equal to the reference frequency times "N" when the loop is locked. The output of the phase detector controls the LO frequency which in turn produces a constant IF. This circuit loop that phase locks the IF signal to the reference signal as described above is called the control PLL.

Because the LO tracks the incoming RF signal to produce the IF signal, the frequency error associated with the incoming RF signal is. eliminated. Any net frequency difference between the received signal carrier and the LO will be eliminated by the control PLL adjusting the frequency of the LO to the frequency of the received signal carrier. The net frequency difference can be set to zero, or to some other fixed frequency offset which may be desired.

As described above, the utilization of a control PLL greatly reduces the frequency error present at the intermediate frequency. The disadvantage of using a control loop is that the control loop modifies the frequency response of the demodulated incoming RF signal. The modification occurs because the control loop PLL has its own bandwidth that is determined by the speed required to achieve phase lock of the IF signal. Low frequency modulating signals that fall within the bandwidth of the control PLL are attenuated which in turn causes the demodulated signal to have a high-pass frequency response.

To recover the low frequency components that are attenuated by the control PLL, one technique taught by the prior art is to use dual port demodulation. An example of this is found in U.S. Pat. No. 4,837,853, entitled "Dual Port FM Demodulation in Phase Locked Receivers", by Joseph P. Heck. In dual port demodulation, the high frequency components that are not attenuated by the control PLL are demodulated by a conventional FM demodulator. The lower frequency components that fall within the bandwidth of the control PLL are recovered by summing the output of the control loop phase detector or the control line input of the control loop VCO with the output of the conventional demodulator. The high frequency components and the low frequency components are properly weighted at the summation stage to provide a substantially flat frequency response that would have conventionally resulted in the FM receiver without the influence of the control PLL.

Referring to FIG. 1, a block diagram of a prior art single conversion FM receiver 100 that utilizes a dual port demodulation method similar to that discussed above is shown. The received FM signal 102 is mixed via mixer 104 with a local oscillator (LO) signal 132. The resulting signal is an intermediate frequency (IF) signal 134. The IF signal 134 then goes through IF bandpass filter 106 which provides the selectivity of the receiver and then through a limiter stage 108 which provides an output signal 110. Output signal 110 is then sent to frequency demodulator 112. Demodulator 112 provides a demodulated signal 114.

Output signal 110 coming from limiter 108 is also provided to the control PLL that controls the frequency of the synthesized LO PLL 130. The control PLL is comprised of mixer 104, IF bandpass filter 106, limiter 108, frequency divider 124, reference oscillator 126, phase detector 128, and LO PLL 130. The control PLL steers LO PLL 130 to the correct frequency in order to develop the desired IF signal 134. A means by which the output frequency of the LO PLL 130 can be controlled is described in U.S. Pat. No. 5,079,526, entitled "Frequency Modulated Synthesizer Using Low Frequency Offset Mixed VCO", by Joseph P. Heck. The control PLL causes the LO PLL 130 to track the received signal 102 so that the intermediate frequency signal 134 is equal to the divider ratio (N) of divider 124 times the loop reference frequency (Fref) from oscillator 126. The full spectrum demodulated output signal 122 is obtained by combining the low frequency information signal 136 with the high frequency information signal 114 into a summing network 120 with the signal weighting provided by gain constants 118 and 116, respectively. The weighting factors $K_1$ and $K_2$ provided by gain constants 118 and 116 account for the voltage to frequency conversion gain factor of the LO VCO 130, and the frequency-to-voltage conversion factor of the FM demodulator 112. Both are adjusted to equally weight the low and high frequency components. The demodulated output signal available at output 122 therefore will be the same response that would have resulted without the interference caused by the control PLL.

In the case that the LO is implemented with a synthesized LO PLL 130 as shown in FIG. 1, the demodulation response of the signal at output 122 will be flat only if the bandwidth of the synthesized LO PLL 130 is much greater that the bandwidth of the control PLL. For practical considerations such as lock time, noise performance, and suppression of spurious sidebands, the bandwidth of the LO PLL 130 may not be set at a value that is much greater than the control PLL's bandwidth. If the bandwidth of the LO PLL is not substantially greater than the control PLL bandwidth, then the LO PLL 130 will induce phase distortion (phase delay) in the feedback path of the control PLL. This phase distortion will result in a dual port demodulation amplitude versus frequency response which is significantly modified from the desired flat response. A need therefore exists for a method and apparatus for compensating PLL circuits, and in one particular embodiment, a circuit which can account for the phase distortion induced by the synthesized LO PLL in order to provide for a substantially flat demodulated frequency response.

DETAILED DESCRIPTION OF THE PREFERRED EMBODIMENT

Figure 1:
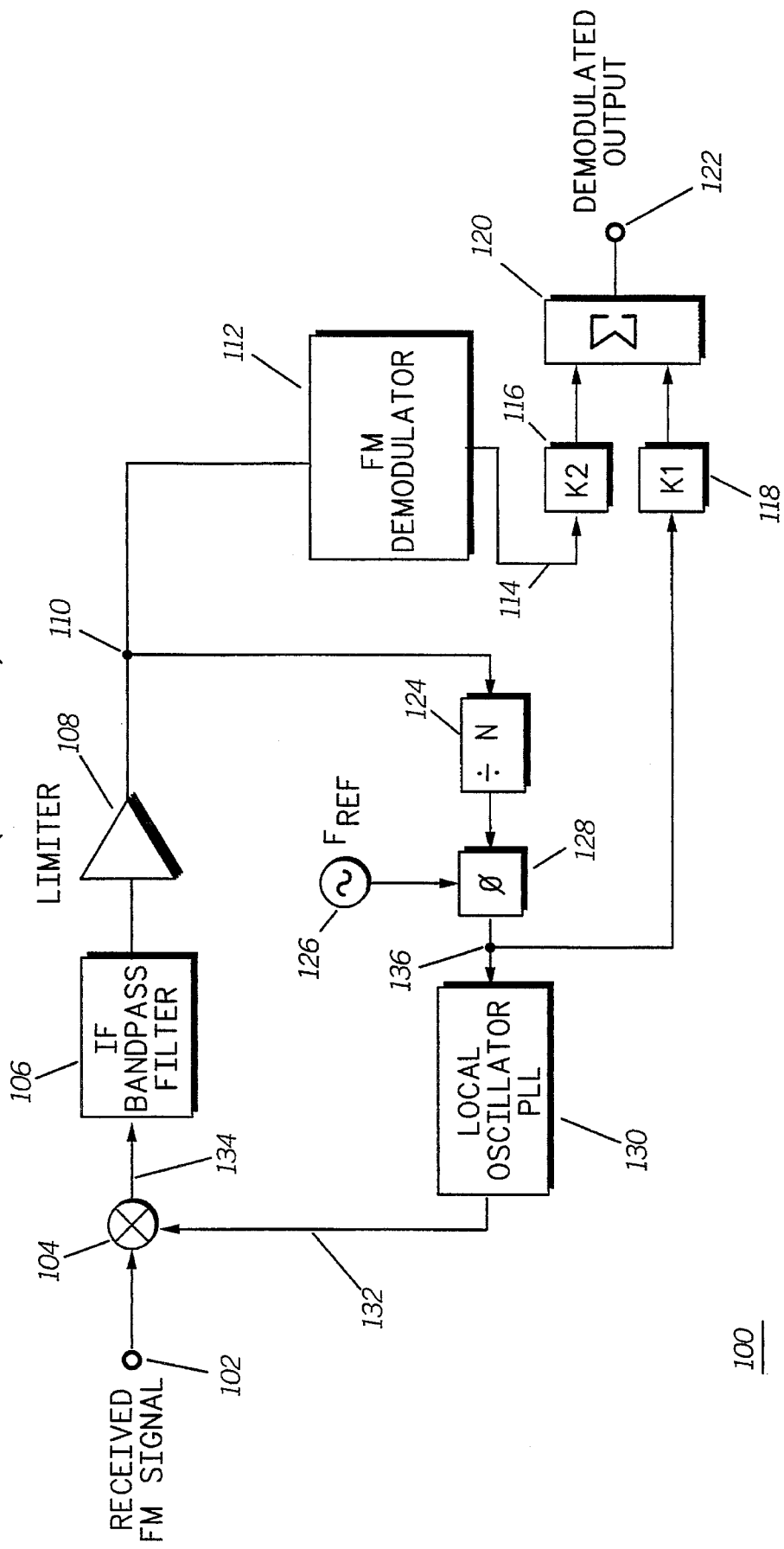
FIG. 1 is a block diagram of a prior art phase-locked controlled FM receiver that utilizes dual port demodulation.

While the specification concludes with claims defining the features of the invention that are regarded as novel, it is believed that the invention will be better understood from a consideration of the following description in conjunction with the drawing figures.

Figure 2:
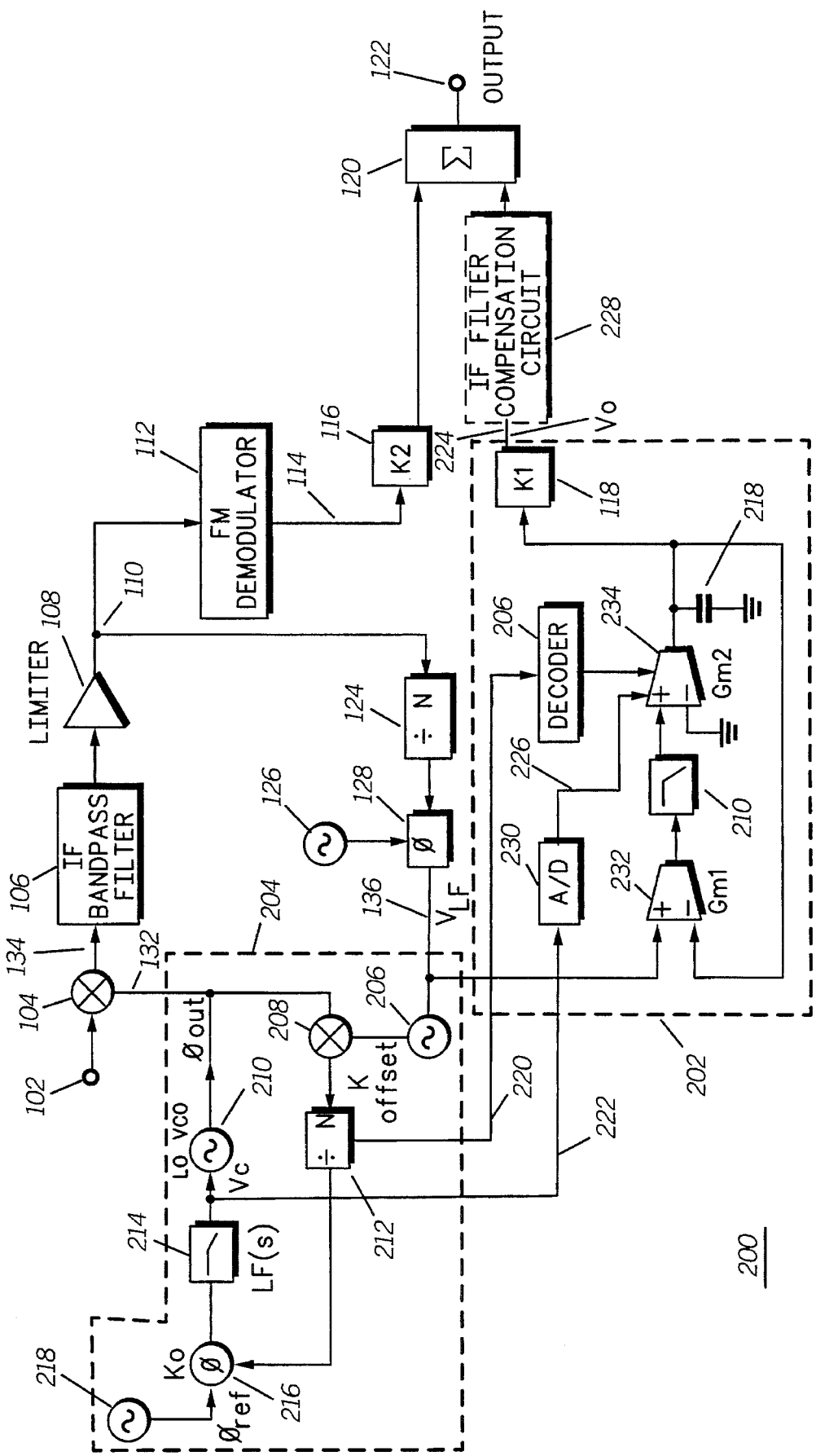
FIG. 2 is a block diagram of a phase-locked controlled FM receiver in accordance with the present invention.

Referring now to FIG. 2, a block diagram of a single-conversion phased locked FM receiver that utilizes demodulation compensation in accordance with the invention is shown. Demodulation compensation network 202 provides a way of accounting for the undesired phase distortion caused by LO PLL 204 during the signal demodulation process.

LO signal 132 from the synthesized LO PLL 204 is mixed with the received FM signal 102 by mixer 104 to produce an IF signal 134. The IF signal 134 then goes through IF bandpass filter 106 and through limiter stage 108. The output signal 110 of limiter stage 108 is then sent to frequency demodulator 112, which provides for a demodulated output signal 114. Output signal 110 from limiter 108 is also provided to the control PLL that sets the frequency of the synthesized LO PLL 204. The control PLL which forms part of the receiver's frequency conversion means comprises mixer 104, IF bandpass filter 106, limiter 108, frequency divider 124, reference oscillator 126, phase detector 128, and LO PLL 204. The control PLL steers the LO PLL 204 to the correct frequency in order to develop the desired IF signal 134. The control PLL causes the LO PLL 204 to track the received signal 102, so that the intermediate frequency signal 134 is equal to the divider ratio (N) of divider 124 times the loop reference frequency (Fref) from oscillator 126. LO PLL 204 consists of offset VCO 206, suppressed-image offset mixer 208, frequency divider 212, phase detector 216, reference oscillator 218, loop filter 214, and VCO 210. The frequency of VCO 210 is equal to the frequency of reference oscillator 218 times the value of N in divider 212 plus the frequency of offset VCO 206. The output frequency of offset VCO 206 is controlled by signal 136. The offset VCO 206 and the offset mixer 208 provide direct FM capability for LO PLL 204.

Because the LO PLL 204 is in the control PLL feedback path, it is important to characterize the effects of the control PLL on the low frequency modulation signal ($V_{LF}$) 136. The modulation transfer function of LO PLL 204 is:

$$LO_m(s) = K_{OFFSET}\left(\frac{K_D \cdot LF(s) \cdot K_O/N \cdot 1/s}{1 + K_D \cdot LF(s) \cdot K_O/N \cdot 1/s}\right)$$

where $K_{OFFSET}$ is the gain of offset VCO 206, $K_D$ is the gain of phase detector 216, LF(s) is the transfer function of loop filter 214, $K_o$ is the gain of VCO 210, and N is the divide ratio of frequency divider 212.

The output of phase detector 128 also provides signal 136 to a LO compensation means such as compensation network 202. The compensation network 202 consists of first operational transconductance amplifier (OTA) 232 which has a gain of $g_{m1}$, filter 210 which has a transfer function Filter(s), a programmable gain stage such as second OTA 234 which has a programmable gain labeled $g_{m2}$, capacitor 218, A/D converter 204, gain stage 118 with gain $K_1$, and divider decoder 206. The purpose of LO compensation network 202 is to provide substantially the same transfer function (same poles and zeros) as LO PLL 204. In this way, the phase distortion that occurs in LO PLL 204 will be duplicated by compensation network 202. The transfer function of network 202 can be calculated as follows:

$$Comp(s) = \frac{V_O(s)}{V_{LF}(s)} = K_1\left(\frac{g_{m1} \cdot Filter(s) \cdot g_{m2} \cdot 1/(sC)}{1 + g_{m1} \cdot Filter(s) \cdot g_{m2} \cdot 1/(sC)}\right)$$

Setting gm1=$K_D$, Filter(s)=LF(s), $g_{m2}/C=K_o/N$, and weighting factor $K_1=K_{OFFSET}$, $$Comp(s) = \frac{V_O(s)}{V_{LF}(s)} = K_{OFFSET} \left( \frac{K_D \cdot LF(s) \cdot K_O/N \cdot 1/s}{1 + K_D \cdot LF(s) \cdot K_O/N \cdot 1/s} \right)$$

Compensation network 202 therefore has the same response as the LO PLL 204 if the LO PLL parameters $K_D$, LF(s), N, and $K_o$ are set as indicated above.

For most applications, $K_D$ and LF(s) are fixed because phase detector 216 and loop filter 214 are constructed with fixed value components that have make tolerances less than +/−5%. However, the value of N from divider 212 and the $K_o$ of VCO 210 are not constant. N will vary as LO PLL 204 is programmed to a specific frequency. The $K_o$ value of VCO 210 will also vary as a function of the VCO control voltage $V_c$. It is therefore necessary for compensation network 202 to adapt to the changes in $K_o$ and N.

To adapt to changes in $K_o$ and N in LO PLL 204, sense lines 220 and 222 are connected from LO PLL 204 to compensation network 202. Sense line 222 sends the control voltage $V_c$ to the compensation network 202. The value of $K_o$ is derived from $V_c$ in A/D converter 230. Sense line 220 sends the value of N of frequency divider 212 to compensation network 202. The value of N is preferably sent as a binary word to decoder 206. A/D converter 230 and decoder 206 then program the gain ($g_{m2}$) of OTA 234 to a value equal to C·$K_o$/N, where C is the value of capacitor 218.

The output of the compensation network 202 appears at 224. The full spectrum demodulated output 122 is obtained by combining the low frequency compensated signal 224 with the high frequency signal 114 in summing network 120 with weighting for signal 114 provided by gain stage 116. The weighting factor $K_2$ accounts for the frequency-to-voltage conversion factor of the FM demodulator 112. The demodulated output signal present at output 122 will therefore be the same response that would have resulted without the influence of the control PLL.

Control voltage $V_c$ is passed to A/D converter 230 via line 222. The gain ($K_o$) of LO VCO 210 is not a parameter such as a voltage or current that can be monitored directly; however, the value of $K_o$ can be derived from the value of $V_c$. To describe the relationship of $K_o$ to $V_c$, a simplified schematic of LO VCO 210 is shown in FIG. 3.

Figure 3:
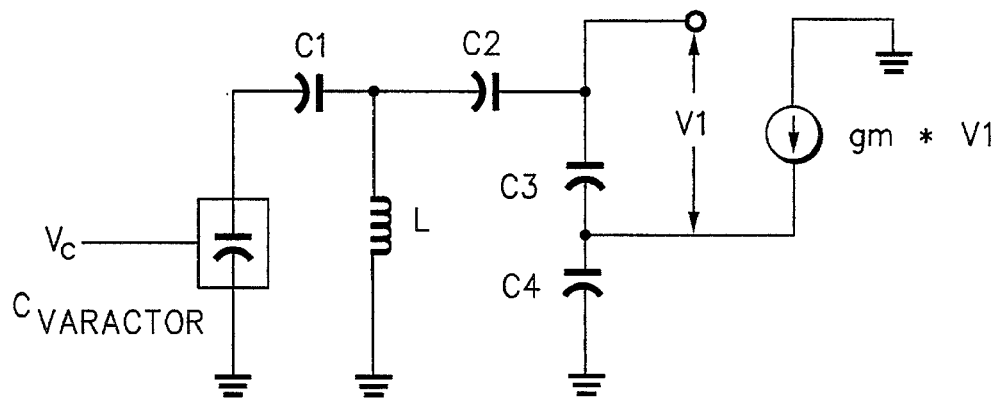
FIG. 3 is a simplified model of a prior art VCO.

FIG. 3 shows a schematic for a voltage-controlled Colpitts oscillator that is conventionally used to implement the VCO function in synthesized LO PLLs. The free-run frequency and $K_o$ are given by:

$$Freq\ out \approx \frac{1}{2\pi} \left( L \left( C_T + \frac{C_1 \cdot C_{varactor}}{C_1 + C_{varactor}} \right) \right)^{-0.5}$$

Where $$C_T = \frac{\frac{C3 \cdot C4}{C3+C4} \cdot C2}{\frac{C3 \cdot C4}{C3+C4} + C2}, \quad C_{varactor} = \frac{C_{jo}}{\left(1 - \frac{V_c}{\phi}\right)^m}$$

and $$K_o = \frac{d}{dV_c}(f_{vco})$$

$V_c$ is the control voltage applied to varactor diode that exhibits a variable capacitance $C_{varactor}$. $C_{jo}$ is the varactor diode capacitance at zero Volts bias, $\phi$ is the varactor barrier potential, and "m" is the varactor gradient factor.

For 73.35 MHz operation using the VCO configuration shown in FIG. 3, the values of $f_{vco}$ and $K_o$ versus control voltage ($V_c$) are shown in Table 1.

TABLE 1

| Cont. Volts ($V_c$) | Freq out (MHz) | $K_o$ (MHz/V) |
|---|---|---|
| 0.0 | 65.745 | — |
| 0.5 | 67.932 | 4.374 |
| 1.0 | 69.447 | 3.030 |
| 1.5 | 70.652 | 2.410 |
| 2.0 | 71.642 | 1.980 |
| 2.5 | 72.507 | 1.730 |
| 3.0 | 73.262 | 1.510 |
| 3.5 | 73.952 | 1.380 |
| 4.0 | 74.567 | 1.230 |
| 4.5 | 75.147 | 1.160 |

The value of $K_o$ can be directly related to the value of $V_c$ as shown in TABLE 1. For example, if we assume that the LO PLL is programmed to lock at 73.35 MHz, $K_o$ is then equal to 1.5 MHz/Volt at a control voltage of 3.2 Volts. A plot of the data in TABLE 1 is shown in FIG. 4.

Component value variations of +/−5% encountered from unit to unit when mass producing the VCO shown in FIG. 3, cause shifts in the VCO's frequency vs $V_c$ operating point. FIG. 5 represents the same VCO as discussed in FIG. 3, but with a shift in component part tolerances of 5%. The value of $K_o$ at 73.35 MHz is now equal to 3.25 MHz/volt at a control voltage of 1.2 volt. Comparing FIG. 4 and FIG. 5, the free-run VCO frequency has shifted 4 MHz higher in FIG. 5, as compared to FIG. 4. This small percentage change in the VCO free-run frequency however has caused a large percentage change in the value of $V_c$ that corresponds to the PLL lock frequency of 73.35 MHz.

Figure 4:
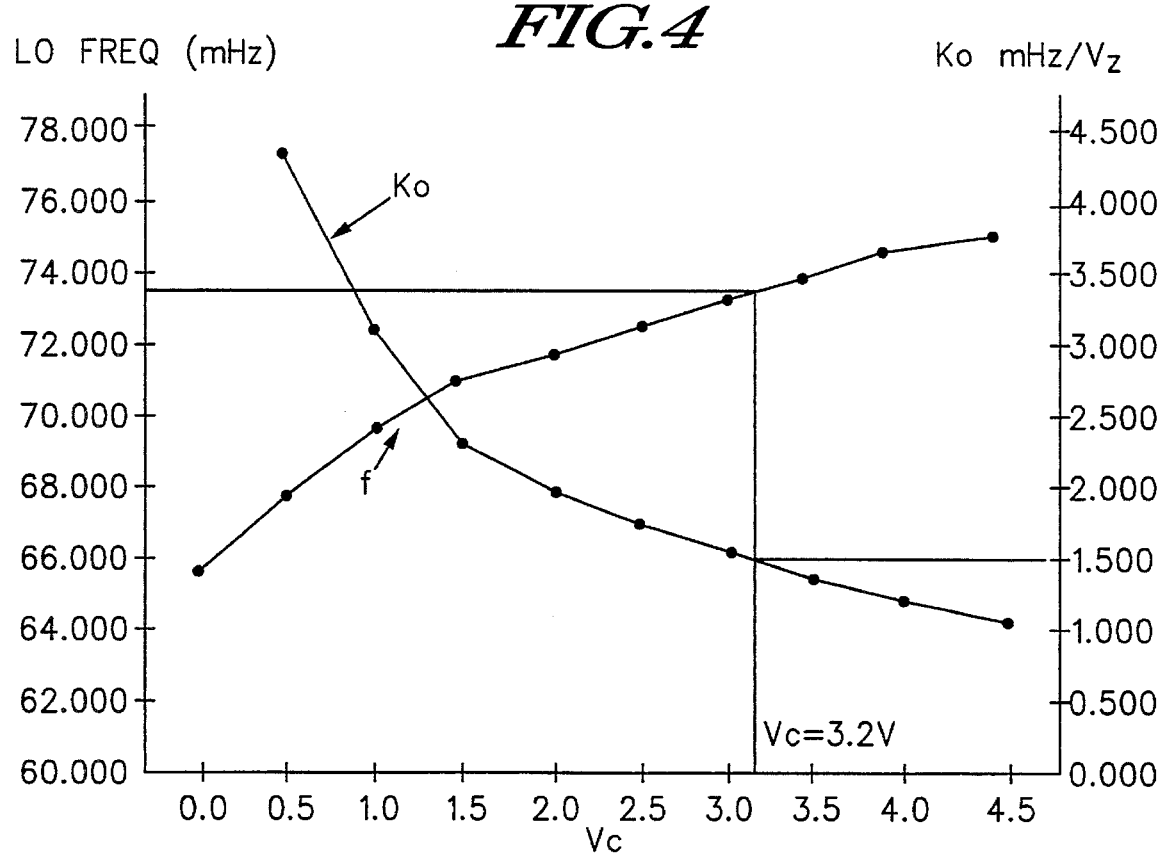
FIG. 4 is a graph showing a typical response of the free-run frequency of the frequency synthesizer's VCO versus control voltage and a plot of the $K_o$ of the frequency synthesizer's VCO versus control voltage.
Figure 5:
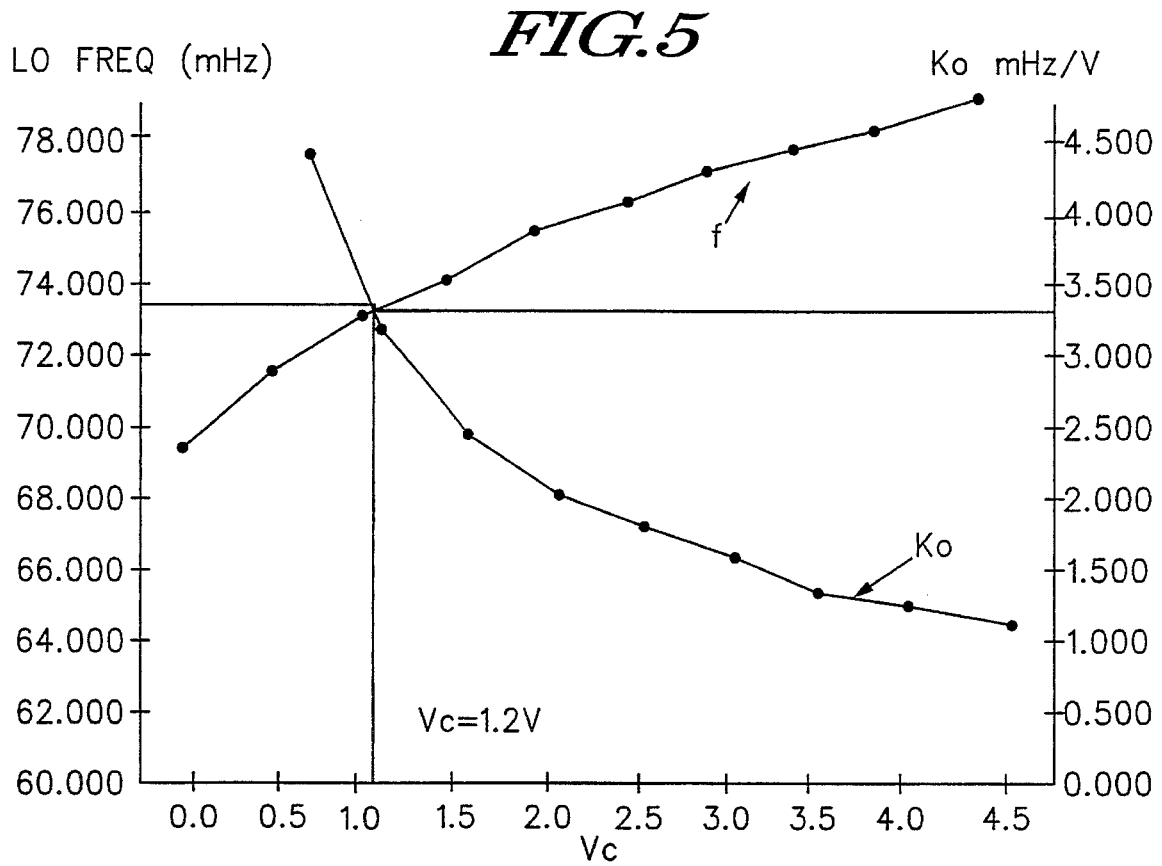
FIG. 5 is a graph showing a typical response of the free-run frequency of the frequency synthesizer's VCO and $K_o$ versus control voltage similar to FIG. 4, but assuming that the VCO has component part tolerances of 5% from those found in FIG. 4.

Compensation of $K_o$ is achieved in the present invention by noting the $K_o$ vs $V_c$ curves in FIGS. 4 and 5 remain the same versus component part tolerances. Therefore, the value of $V_c$ is reliably used to determine the value of $K_o$. Preferably, the $K_o$ versus $V_c$ plot of the VCO is obtained prior to production of the FM receiver and the relationship is mapped into compensation circuit 202. This can be done in a number of ways, preferably the $K_o$ versus $V_c$ relationship is mapped into the A/D converter 230 where quantized values of $K_o$ are represented as digital words. With this technique no memory storage is required. Another way of mapping the $K_o$ versus $V_c$ values is by using a controller having memory storage capability such as EEPROM storage locations when implementing A/D 230 and decoder 206.

Figure 6:
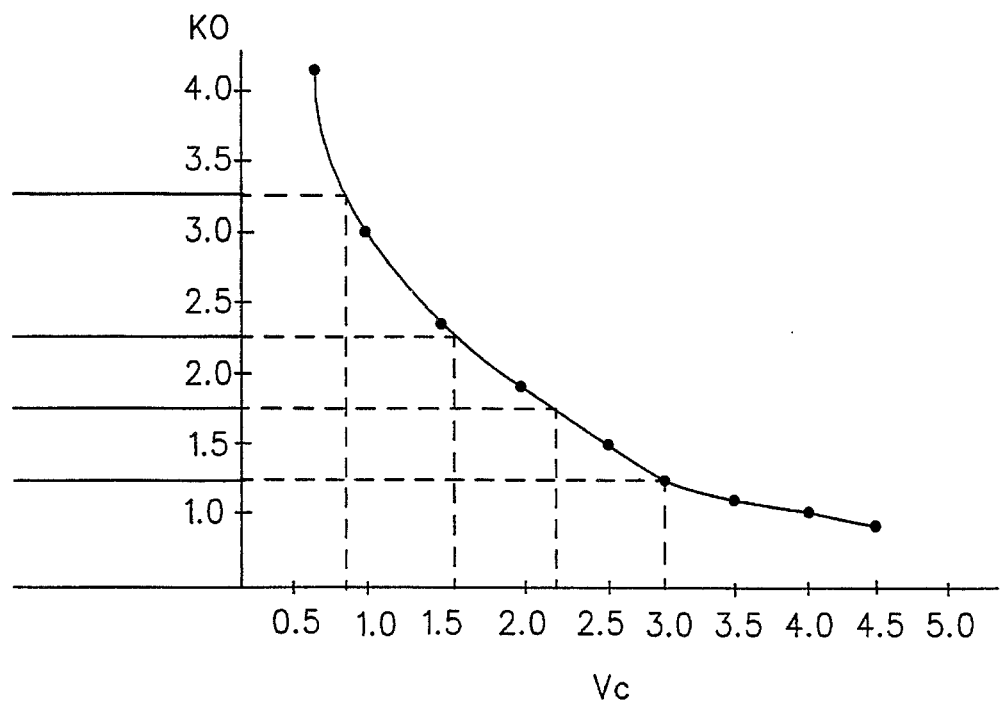
FIG. 6 is a plot of $K_o$ vs $V_c$ showing gain adjustment steps in accordance with the invention.

A/D converter 230 monitors the control voltage $V_c$ through sense line 222 and provides gain adjustment to OTA 234. A/D 204 provides a non-linear output that maps the $K_o$ vs $V_c$ relationship as shown in FIG. 6. The tabulated values from FIG. 6 are shown in Table 2 below:

TABLE 2

| $V_c$ | Ko (MHz/V) | Quantized Ko (MHz/V) | A/D Output |
|---|---|---|---|
| $V_c \leq 0.7$ | Ko ≥ 3.2 | $K_{o1} = 3.5$ | 00000 |
| $0.7 < V_c \leq 1.5$ | $2.3 \leq K_o < 3.2$ | $K_{o2} = 2.8$ | 00010 |
| $1.5 < V_c \leq 2.2$ | $1.75 \leq K_o < 2.3$ | $K_{o3} = 2.0$ | 00100 |
| $2.2 < V_c \leq 3.0$ | $1.2 \leq K_o < 1.75$ | $K_{o4} = 1.6$ | 01000 |
| $V_c > 3.9$ | $K_o \leq 1.2$ | $K_{o5} = 1.0$ | 10000 |

A/D converter 202 is a conventional parallel A/D converter that in the preferred embodiment utilizes 5 reference voltages that determine the 5-bit output word as shown in Table 2. The reference voltages derived from a resistive ladder are 0.7 V, 1.5 V, 2.2 V, 3.0 V and 3.9 Volts. The Analog-to-Digital conversion process quantizes the value of $K_o$ into 5 discrete values which are labeled $K_{o1}$–$K_{o5}$. For example, if $V_c$ is equal to 1.2 V, the A/D converts 1.2 V to a 00010 digital output which corresponds to a $K_o$ equal to 2.8 MHz/volt. If necessary, the quantization error due to the A/D conversion process may be reduced by increasing the resolution of A/D (adding more bits). The digital output from A/D 204 is coupled to the gain adjustment stage of OTA 212 via bus 226.

The gain of OTA 234 is also set by decoder 206. Decoder 206 monitors the programming bits that set the N value of divide by N circuit 212 in LO PLL 204 through sense line 220. For example, in the preferred embodiment, the programmable value of N is either 22 or 34. In accordance with the invention, the value of N is detected and then applied to the gain control of OTA 212. If the value of N is 22, then the decoder outputs a logic 0. If N is equal to 34 then the decoder outputs a logic 1. In cases where divider 212 divides using more than two values for N, more bits can be used in order to properly adjust OTA 212.

Figure 7:
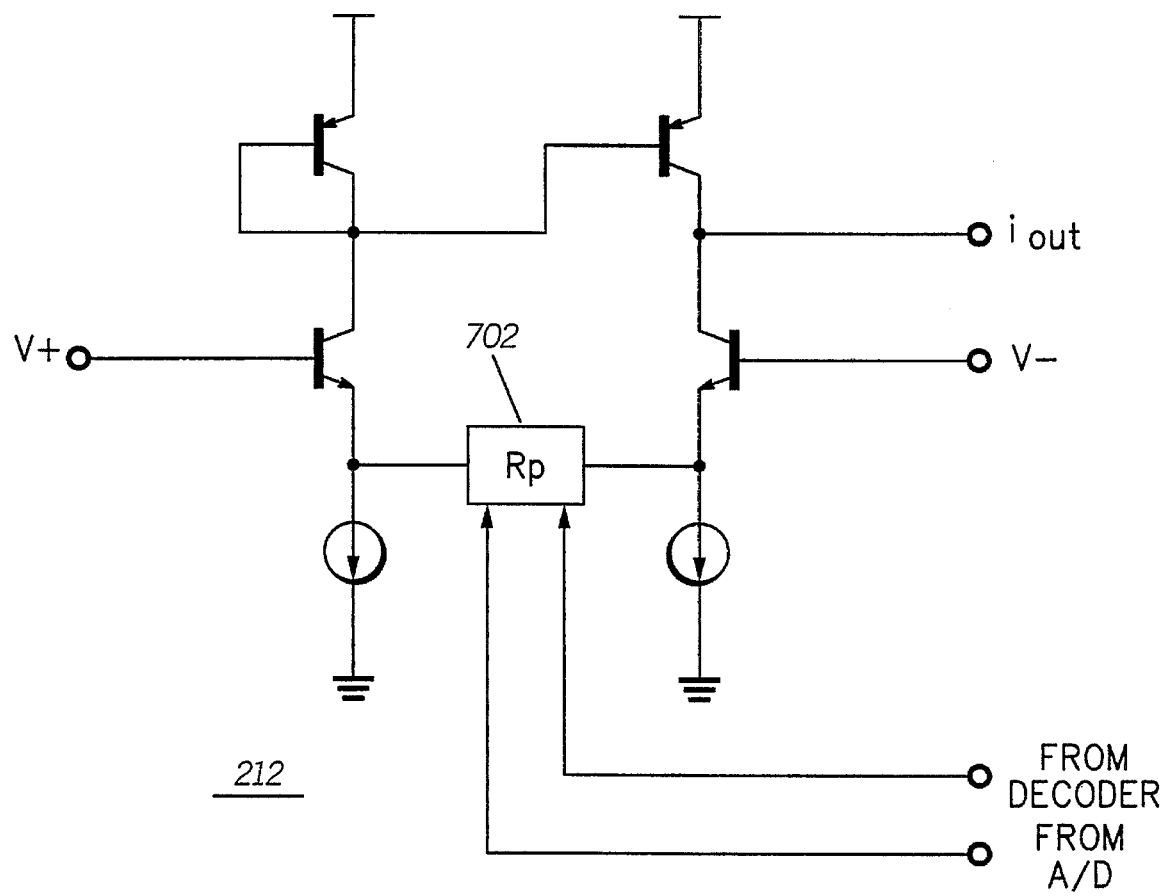
FIG. 7 is a simplified schematic of a variable gain transconductance amplifier in accordance with the invention.

Referring to FIG. 7, a simplified diagram of variable gain OTA 234 in accordance with the invention is shown. The gain ($g_{m2}$) of OTA 234 is equal to 2 divided by the programmed resistance (Rp) of the resistor network 702. Depending on the digital inputs from A/D 230 and decoder 206, the resistive network Rp 702 is programmed and thereby the gain ($g_{m2}$) of OTA 212 is programmed to one of the following values shown in Table 3.

TABLE 3

| A/D | Decoder | Rp | $g_{m2}$ |
|---|---|---|---|
| 00001 | 0 | $2/(K_{o1} \cdot 1/N1 \cdot C)$ | $K_{o1} \cdot 1/N1 \cdot C/2$ |
| 00001 | 1 | $2/(K_{o1} \cdot 1/N2 \cdot C)$ | $K_{o1} \cdot 1/N2 \cdot C/2$ |
| 00010 | 0 | $2/(K_{o2} \cdot 1/N1 \cdot C)$ | $K_{o2} \cdot 1/N1 \cdot C/2$ |
| 00010 | 1 | $2/(K_{o2} \cdot 1/N2 \cdot C)$ | $K_{o2} \cdot 1/N2 \cdot C/2$ |
| 00100 | 0 | $2/(K_{o3} \cdot 1/N1 \cdot C)$ | $K_{o3} \cdot 1/N1 \cdot C/2$ |
| 00100 | 1 | $2/(K_{o3} \cdot 1/N2 \cdot C)$ | $K_{o3} \cdot 1/N2 \cdot C/2$ |
| 01000 | 0 | $2/(K_{o4} \cdot 1/N1 \cdot C)$ | $K_{o4} \cdot 1/N1 \cdot C/2$ |
| 01000 | 1 | $2/(K_{o4} \cdot 1/N2 \cdot C)$ | $K_{o4} \cdot 1/N2 \cdot C/2$ |
| 10000 | 0 | $2/(K_{o5} \cdot 1/N1 \cdot C)$ | $K_{o5} \cdot 1/N1 \cdot C/2$ |
| 10000 | 1 | $2/(K_{o5} \cdot 1/N2 \cdot C)$ | $K_{o5} \cdot 1/N2 \cdot C/2$ |

Programmable resistive network 702 is designed to provide the 10 values of Rp given in Table 3 according to the logic input from the A/D 230 and the N decoder 206. C is the capacitance of capacitor 218.

As an example of the design of the programmable resistive network 702, if C=50 pF, N1=22, and N2=34, and the values of $K_{o1}$–$K_{o5}$ as provided in Table 2, for an A/D and N decoder input of 00010 and 0 respectively, the value of $R_p$ is calculated as follows:

$R_p = 2/(K_{o2} \cdot C/N1) = 2/(2.8 \text{ E6} \cdot 50 \text{ E-12}/22)$

Rp(with A/D=00010 and decoder=0)=314.2 KΩ

In a similar manner, the remaining values of $R_p$ are calculated and assigned to the resistive network. Resistive network 702 consists of resistors and transmission gates. The transmission gates are controlled by the A/D and decoder inputs to provide the desired value of $R_p$.

A/D 204 may be replaced by a log amplifier that exhibits the same $K_o$ versus $V_c$ response as the VCO 210. In the case a log amplifier is used, the output current or voltage of the amplifier would control the gain of either a current-controlled or voltage-controlled OTA as opposed to the resistively controlled OTA used in the present invention.

Referring back again to FIG. 2, the bandwidth of filter 106 was assumed in the previous discussion to be substantially greater than the bandwidth of the control loop PLL so that the phase delay caused by filter 106 is negligible over the frequency range of the control loop PLL. However, in certain narrow band applications such as 12.5 KHz narrow band FM, an extremely narrow IF filter bandwidth may be required to meet the receiver selectivity specifications. In this case, the phase delay caused by the IF filter 106 will affect the flatness of the two port demodulation response. The amount of distortion is dependent on the magnitude of the phase delay that occurs within the bandwidth of the control loop PLL. To compensate for the phase delay caused by the IF filter 106, an IF filter compensation network 228 has been added in series with the low frequency summation path. This added compensation network 228 must exhibit the same phase delay as does the IF filter 106 over the bandwidth of the control PLL. If the phase delay of the IF filter compensation network is the same as the IF filter, the two-port demodulation response (both amplitude and phase versus modulating frequency) at the output of the summation network will be flat as desired.

Figure 9:
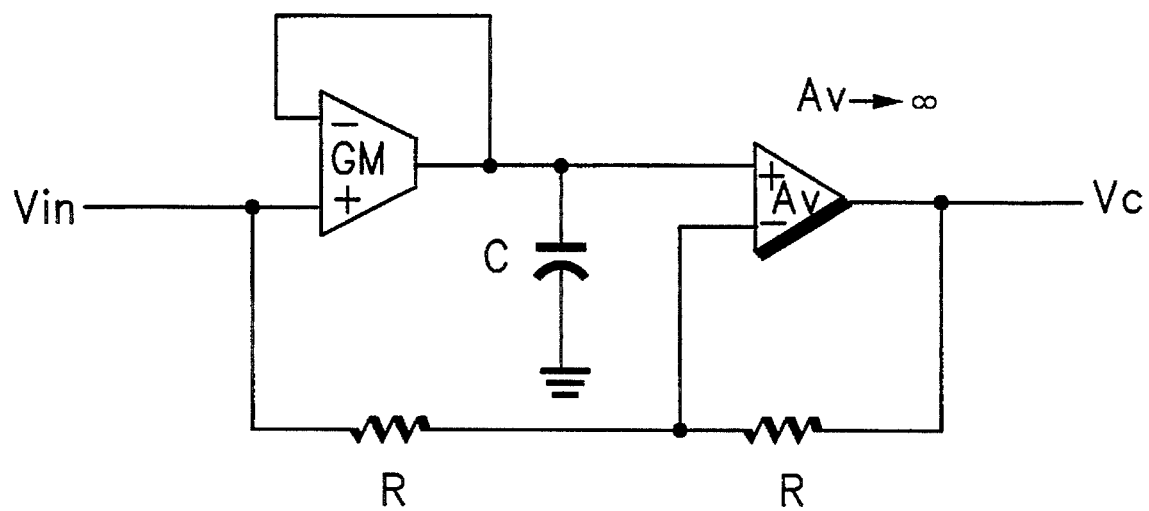
FIG. 9 is a simplified schematic of a unity gain phase shift network as used in the filter compensation circuit shown in FIGS. 2 and 8.

The narrow IF filter 106 may be implemented with a Gaussian bandpass filter that exhibits an essentially linear phase shift over its passband. The optional IF filter compensation network 228 preferably consists of a unity gain all-pass phase shifter that exhibits essentially the same phase delay as the Gaussian filter over the bandwidth of the control PLL. The unity gain phase shifter is shown in FIG. 9. The complexity (i.e. number of components) of the unity gain phase shifter is much less than the complexity of the Gaussian IF filter 106; however, the compensation network 228 could be comprised of a low-pass duplication of the Gaussian IF filter 106.

Figure 8:
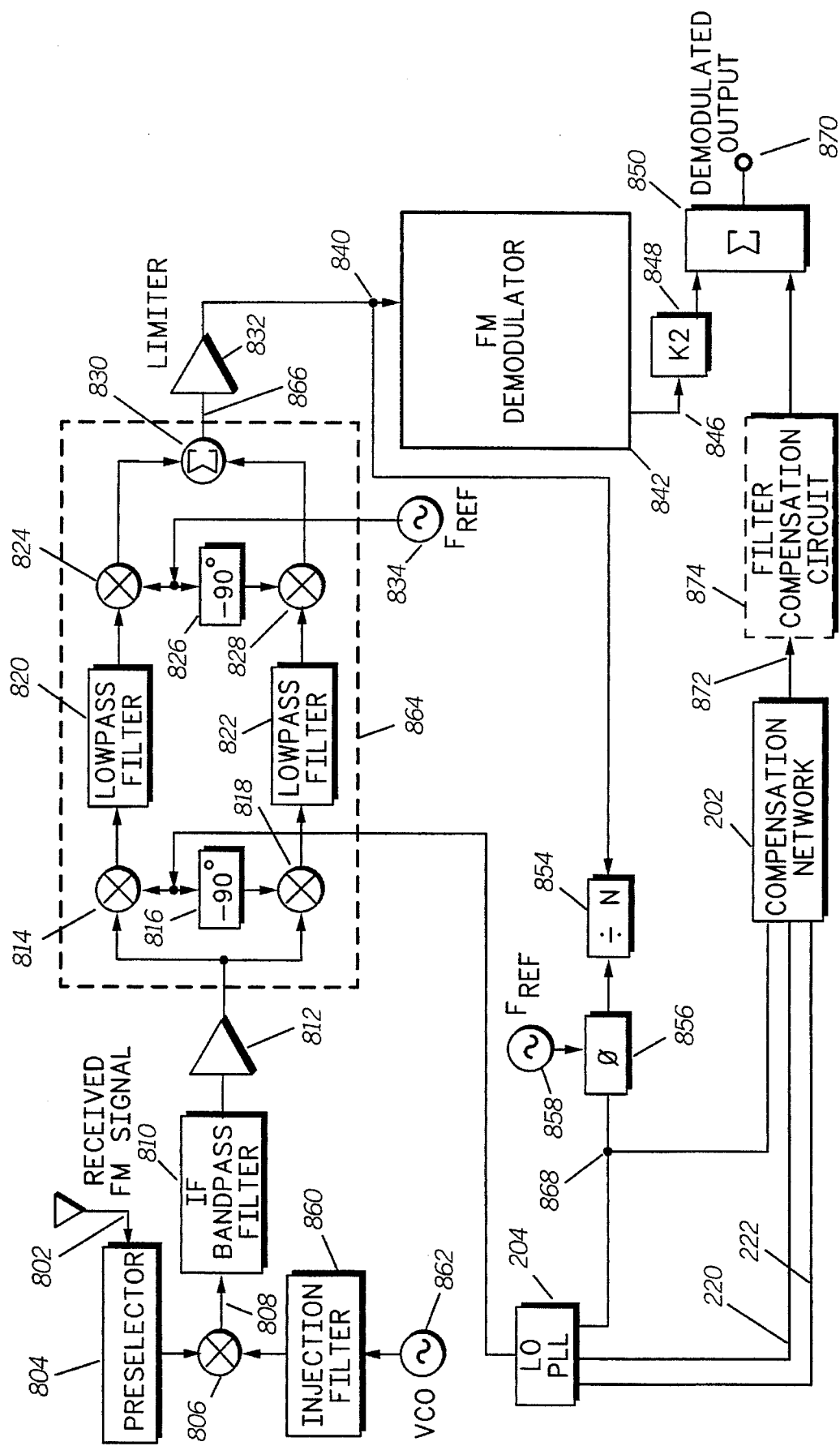
FIG. 8 is a block diagram of a second embodiment of a FM receiver using a compensation network in accordance with the present invention.

Referring now to FIG. 8, a direct conversion receiver utilizing the present invention's compensation circuit is shown. The received signal from antenna 802 goes through a preselector 804, which restricts the band of signals at the input of mixer 806 and prevents those at the image frequency from being converted into IF signals. Injection filter 860 removes sideband noise and spurious signals from the local oscillator signal 862.

The IF signal 808 coming from first conversion mixer 806 is filtered by IF bandpass filter 810 and then gain adjusted by amplifier 812 prior to being coupled to direct conversion IF stage 864. The IF signal is coupled to quadrature paths 814, 820, 824 and 818, 822, 828, which each comprises a down-conversion mixer, a low-pass filter, and an up-conversion mixer. The quadrature outputs combine in summing stage 830 to provide a filtered, third IF signal at 866. LO PLL 204 and phase shifter 816 provide the down-conversion signals; reference oscillator 834 and phase shifter 826 provide the up-conversion signals.

The third IF signal at 866 follows a path similar to that in the receiver of FIG. 2. The signal is coupled to limiter 832 which provides a limited IF signal 840, which goes to FM demodulator 842. The demodulated output appears at 846.

The limited IF signal 840 is also sent to a divider circuit 854 and phase detector 856. Phase detector 856 receiving a reference signal from signal reference 858. The output of phase detector 868 is then provided to an LO PLL circuit 204 as previously discussed. The VCO control voltage from LO PLL 204 is sent via line 222 to compensation circuit 202, while the divide-by N value from the divider circuit located within LO PLL 204 is sent via line 220 to compensation circuit 202.

Compensation circuit 202 and optional filter compensation circuit 874 operate in similar fashion to as previously discussed above with respect to the receiver shown in FIG. 2. The low frequency output 872 from compensation circuit 202 and the high frequency output 846 are combined via combining means 850 which is preferably a summation circuit. Prior to being combined, high frequency signal 846 is weighted using weighting factor circuit (K₂) 848. The low frequency signal is weighted inside of compensation circuit 202 as previously discussed.

Receiver 800 recovers modulation as in the examples above. The compensated low-frequency recovered demodulation signal, which appears at 872, combines with the high frequency demodulation signal 846 from the frequency demodulator. Summing network 850, with weighting inputs 848 (K₂) and K₁ which is located within compensation network 202, provides for a flat recovered modulation at output 870.

In some cases, similar to the discussion with respect to the receiver in FIG. 2, the bandwidth of IF filters 822 and 820 may be substantially greater than the bandwidth of the control loop PLL so that the phase delay caused by filters 820 and 822 is negligible over the frequency range of the control loop PLL. However, in certain narrow band applications such as 12.5 KHz narrow band FM, an extremely narrow IF filter bandwidth may be required to meet the receiver selectivity specifications. In this case, the phase delay caused by the IF filters 820 and 822 will affect the flatness of the two port demodulation response. The amount of distortion is dependent on the magnitude of the phase delay that occurs within the bandwidth of the control loop PLL. To compensate for the phase delay caused by the baseband IF filters 820 and 822, an IF filter compensation network 874 has been added in series to the low frequency summation path, similar to how filter compensation circuit 228 was added to the circuit in FIG. 2. IF filter compensation network 874 must exhibit essentially the same phase delay as does IF filters 820 and 822 over the bandwidth of the control PLL. If the phase delay of the IF filter compensation network 874 is substantially the same as the IF filter delay found in filters 820 and 822, the two-port demodulation response at the output of the summation network 870 will be substantially flat as desired.

The narrow IF filters 820 and 822 are implemented with identical Gaussian low-pass filters that exhibit an essentially linear phase shift over the filter's passband. The IF filter compensation network 874 preferably comprises a unity gain all-pass phase shifter as shown in FIG. 9 that exhibits essentially the same phase delay as Gaussian filters 820 and 822 over the bandwidth of the control PLL.

In summary, the present invention provides a means for compensating for the undesired effects caused by a synthesized LO on the dual port demodulation of a phase-locked FM receiver. A compensation network that exhibits the same transfer response as the synthesized LO PLL is placed in the low frequency demodulation path. By duplicating the amplitude and phase delay of the synthesized LO, and by tracking changes in the parameters of the synthesized LO, a flat demodulated frequency response is achieved independent of the bandwidth of the synthesized LO. In the case that the bandwidth of the IF filter is not substantially greater than the bandwidth of the control loop, then an IF filter compensation network is placed in the low frequency demodulation path in series with the LO compensation network. By duplicating the phase delay of the IF filter, a flat demodulated response is achieved. While the preferred embodiments of the invention have been illustrated and described, it will be clear that the invention is not so limited. The LO compensation according to this invention can also be used in dual conversion and Zero-IF (ZIF) based phase locked receivers. Numerous modifications, changes, variations, substitutions and equivalents will occur to those skilled in the art without departing from the spirit and scope of the present invention as defined by the appended claims.

What is claimed is:

1. A radio frequency receiver, comprising:

a control loop phase-locked loop (PLL), the control loop PLL including an input terminal for receiving a modulated radio frequency signal and including a local oscillator phase lock loop (PLL) generating a local oscillator (LO) signal, the control loop PLL provides an intermediate frequency signal and a low frequency demodulated signal, the local oscillator PLL responsive to the low frequency demodulated signal for tracking the modulated radio frequency signal and characterized by a transfer function;

a demodulator coupled to the control loop PLL for demodulating the intermediate frequency signal and producing a high frequency recovered demodulated signal;

a compensation circuit characterized by a transfer function which is substantially the same as the transfer function of the local oscillator PLL, the compensation circuit is responsive to the low frequency demodulated signal for providing a low frequency compensated demodulated signal which has substantially the same transfer function as that which is induced by the local oscillator PLL; and a summing network for combining the low frequency compensated demodulated signal and the high frequency recovered demodulated signal to provide a recovered demodulated signal having a substantially flat frequency response.

2. A radio frequency receiver as defined in claim 1, wherein the control loop PLL further includes an intermediate frequency (IF) filter having a predetermined phase versus frequency response and wherein the radio frequency receiver further includes:

an IF filter compensation circuit having a phase versus frequency response substantially the same as the phase versus frequency response of the IF filter, the IF filter compensation circuit having an input terminal for receiving the low frequency compensated demodulated signal and an output terminal coupled to the summing network.

3. A radio frequency receiver as defined in claim 1, wherein the local oscillator PLL comprises:

a voltage-controlled oscillator (VCO) having a gain (Ko) and an input port for receiving a control voltage, said control voltage representing component make tolerances of the VCO; and the compensation circuit is responsive to the control voltage for converting the control voltage into a compensation gain factor which tracks variations in the gain (Ko) of the VCO.

4. A radio frequency receiver as defined in claim 3, wherein the compensation circuit further comprises a programmable gain stage and the compensation gain factor is applied to the programmable gain stage in order to adjust its gain.

5. A radio frequency receiver as defined in claim 3 wherein the radio frequency receiver comprises a single conversion receiver.

6. A radio frequency receiver as defined in claim 3, wherein the radio frequency receiver comprises a direct conversion receiver.

7. A radio frequency receiver as defined in claim 4, wherein the compensation circuit further comprises:

an analog-to-digital (A/D) converter having an input and an output;

the input of the A/D converter receives the control voltage; and the A/D converter converts the control voltage into a digital representation of the compensation gain factor which is presented at the output of the A/D converter.

8. A radio frequency receiver, comprising:

a control loop phase lock loop (PLL) for receiving a frequency modulated signal and generating an intermediate frequency (IF) signal and a low frequency demodulated signal, the control loop PLL, including:

a local oscillator phase-locked loop (PLL) having a predetermined transfer function and providing a local oscillator (LO) signal, the LO signal being combined with the frequency modulated signal to generate the IF signal, the local oscillator PLL including:

a voltage-controlled-oscillator (VCO) having a gain ($K_o$) and an input and output;

a divider circuit coupled to the output of the VCO, the divider circuit dividing by a value N;

a phase detector coupled to the divider circuit; and a filter having an input coupled to the phase detector and an output coupled to the VCO, the filter providing a control voltage to the VCO;

a demodulator coupled to the control loop PLL for demodulating the IF signal and producing a high frequency recovered demodulated signal;

a compensation circuit coupled to the local oscillator PLL for receiving the low frequency demodulated signal, the compensation circuit having a transfer function which is substantially the same as the transfer function of the local oscillator PLL to provide a low frequency compensated signal, said compensation circuit including:

an analog-to-digital circuit for converting the control voltage of the local oscillator's VCO into a first digital signal which substantially tracks variations in the VCO's gain ($K_o$);

a decoder circuit for decoding the divide-by N value and converting it into a second digital signal which is a representation of the value N; and a programmable gain stage which receives the first and second digital signals, the gain of the programmable gain stage is adjusted based on the first and second digital signals to provide a low frequency compensated signal; and a summing network coupled to the programmable gain stage and the demodulator for summing the low frequency compensated signal and the high frequency recovered demodulated signal to provide a substantially flat frequency response.

9. A method for compensating for changes in the demodulated signal frequency response caused by a control loop phase-locked loop (PLL) which is part of a radio frequency receiver which demodulates a frequency modulated (FM) carrier signal, the control loop PLL including a local oscillator PLL generating a local oscillator (LO) signal and having a transfer function, the method comprising the steps of:

(a) converting the FM carrier signal and the LO signal to an intermediate frequency signal within the control loop PLL;

(b) converting the intermediate frequency signal to a low frequency information signal within the control loop PLL;

(c) demodulating the IF signal to generate a high frequency demodulated signal; and (d) compensating the low frequency information signal by providing it to a compensation circuit which has substantially the same transfer function as the local oscillator PLL to provide a low frequency compensated signal; and (e) summing the low frequency compensated signal with the high frequency demodulated signal to provide a substantially flat demodulated signal frequency response.

10. A method for compensating for changes in the demodulated signal frequency response caused by a control loop phase-locked loop (PLL) as defined in claim 9, wherein the local oscillator PLL includes a voltage-controlled oscillator (VCO) which has a gain and which receives a control voltage, and wherein step (c) comprises the steps of:

(c1) providing the VCO's control voltage to the compensation circuit;

(c2) converting the control voltage at the compensation circuit into a compensation signal which corresponds to variations in the gain of the VCO; and (c3) providing the low frequency information signal to a gain stage which adjusts the level of the low frequency information signal in response to the compensation signal.

11. A method as defined in claim 10, wherein step (c2) comprises the steps of:

determining the level of the control voltage; and providing a digital signal which substantially tracks variations in the gain of the VCO.

12. A method for compensating for changes in the demodulated signal frequency response caused by a control loop phase-locked loop (PLL) which is part of a radio frequency receiver which demodulates a frequency modulated (FM) carrier signal, the control loop PLL including a local oscillator PLL having a voltage-controlled oscillator (VCO) which receives a control voltage and is characterized by a gain, the local oscillator PLL generates a local oscillator (LO) signal and is characterized by a transfer function, the method comprising the steps of:

(a) converting the FM carrier signal and the LO signal to an intermediate frequency (IF) signal within the control loop PLL;

(b) converting the IF signal to a low frequency information signal within the control loop PLL;

(c) demodulating the IF signal to provide a high frequency demodulated signal;

(d) compensating the low frequency information signal by providing it to a compensation circuit which has substantially the same transfer function as the local oscillator PLL, the step of compensating including the sub-steps of:

(d1) providing the VCO's control voltage to the compensation circuit;

(d2) converting the control voltage at the compensation circuit into a digital signal which substantially tracks variations in the gain of the VCO; and (d3) providing the low frequency information signal to a gain stage which adjusts the level of the low frequency information signal in response to the digital signal to provide a low frequency compensated signal; and (e) summing the low frequency compensated signal with the high frequency demodulated signal to provide a substantially flat demodulated signal frequency response.

13. A radio frequency receiver for demodulating a frequency modulated (FM) carrier signal, comprising:

a control phase lock loop (PLL);

a local oscillator phase lock loop (PLL) coupled to the control PLL and generating a local oscillator (LO) signal, the control PLL converting the FM carrier signal and the LO signal into an intermediate frequency (IF) signal, the LO PLL being characterized by a transfer function;

a demodulator coupled to the control PLL for demodulating the IF signal and providing a high frequency recovered demodulated signal;

the control PLL converting the IF signal into a low frequency demodulated signal, the low frequency demodulated signal being applied to the LO PLL for tracking the FM carrier signal;

a compensation circuit characterized by substantially the same transfer function as that of the LO PLL, the compensation circuit coupled to the control PLL for receiving the low frequency demodulated signal and providing a low frequency compensated signal; and a summing network for combining the low frequency compensated signal and the high frequency recovered demodulated signal into a substantially flat frequency response.

* * * * *